(12) United States Patent
Romanov

(10) Patent No.: US 7,859,281 B2
(45) Date of Patent: Dec. 28, 2010

(54) FINGER TESTER FOR TESTING UNPOPULATED PRINTED CIRCUIT BOARDS AND METHOD FOR TESTING UNPOPULATED PRINTED CIRCUIT BOARDS USING A FINGER TESTER

(75) Inventor: Victor Romanov, Wertheim (DE)

(73) Assignee: ATG Luther & Maelzer GmbH, Wertheim/Reicholzheim (DE)

( * ) Notice: Subject to any disclaimer, the term of this patent is extended or adjusted under 35 U.S.C. 154(b) by 98 days.

(21) Appl. No.: 12/097,824

(22) PCT Filed: Nov. 15, 2006

(86) PCT No.: PCT/EP2006/010964

§ 371 (c)(1),
(2), (4) Date: Jun. 17, 2008

(87) PCT Pub. No.: WO2007/090447

PCT Pub. Date: Aug. 16, 2007

(65) Prior Publication Data

US 2008/0272793 A1    Nov. 6, 2008

(30) Foreign Application Priority Data

Feb. 10, 2006  (DE) ................ 10 2006 006 255

(51) Int. Cl.
*G01R 31/02* (2006.01)
(52) U.S. Cl. ..................... 324/754; 324/758
(58) Field of Classification Search ............... None
See application file for complete search history.

(56) References Cited

U.S. PATENT DOCUMENTS

| | | | |
|---|---|---|---|
| 5,150,041 A * | 9/1992 | Eastin et al. ............. 324/758 |
| 5,408,189 A * | 4/1995 | Swart et al. ............. 324/758 |
| 5,977,776 A | 11/1999 | Huth et al. |
| 6,344,751 B1 | 2/2002 | Prokopp et al. |
| 6,384,614 B1 | 5/2002 | Hager et al. |
| 6,545,458 B2 * | 4/2003 | Yamazaki ............. 324/158.1 |
| 7,015,711 B2 | 3/2006 | Rothaug et al. |
| 7,190,182 B2 | 3/2007 | Romanov |

(Continued)

FOREIGN PATENT DOCUMENTS

DE    31 20 114 A1    1/1983

(Continued)

OTHER PUBLICATIONS

International Search Report from International Application No. PCT/EP2006/010964, filed on Nov. 15, 2006, dated Feb. 15, 2007.

(Continued)

*Primary Examiner*—Minh N Tang
(74) *Attorney, Agent, or Firm*—Houston and Eliseeva, LLP

(57) ABSTRACT

A finger tester for testing non-componented printed circuit boards uses two or more test fingers, each having a test probe. A detection device is provided above each test probe for optical detection of the position above the circuit board of at least one contact tip of the test probe. The detection devices of the test fingers are each arranged in different vertically spaced planes, so that areas of the detection devices located above the test fingers are positioned above one another, aligned vertically to prevent contact during testing.

27 Claims, 8 Drawing Sheets

U.S. PATENT DOCUMENTS

2005/0001639 A1  1/2005  Romanov

FOREIGN PATENT DOCUMENTS

| DE | 102 20 343 A1 | 11/2003 |
| DE | 10 2006 005 800 A1 | 8/2007 |
| EP | 0 468 153 A1 | 1/1992 |
| EP | 0 853 242 A1 | 7/1998 |
| EP | 0 989 409 A1 | 3/2000 |
| EP | 0 990 912 A2 | 4/2000 |
| EP | 1 122 546 A2 | 8/2001 |
| EP | 1 451 594 | 9/2004 |
| WO | 03/096037 A1 | 11/2003 |

OTHER PUBLICATIONS

English translation of the International Preliminary Report on Patentability dated Sep. 9, 2008, from International Application No. PCT/EP2006/010964, filed on Nov. 15, 2006.

* cited by examiner

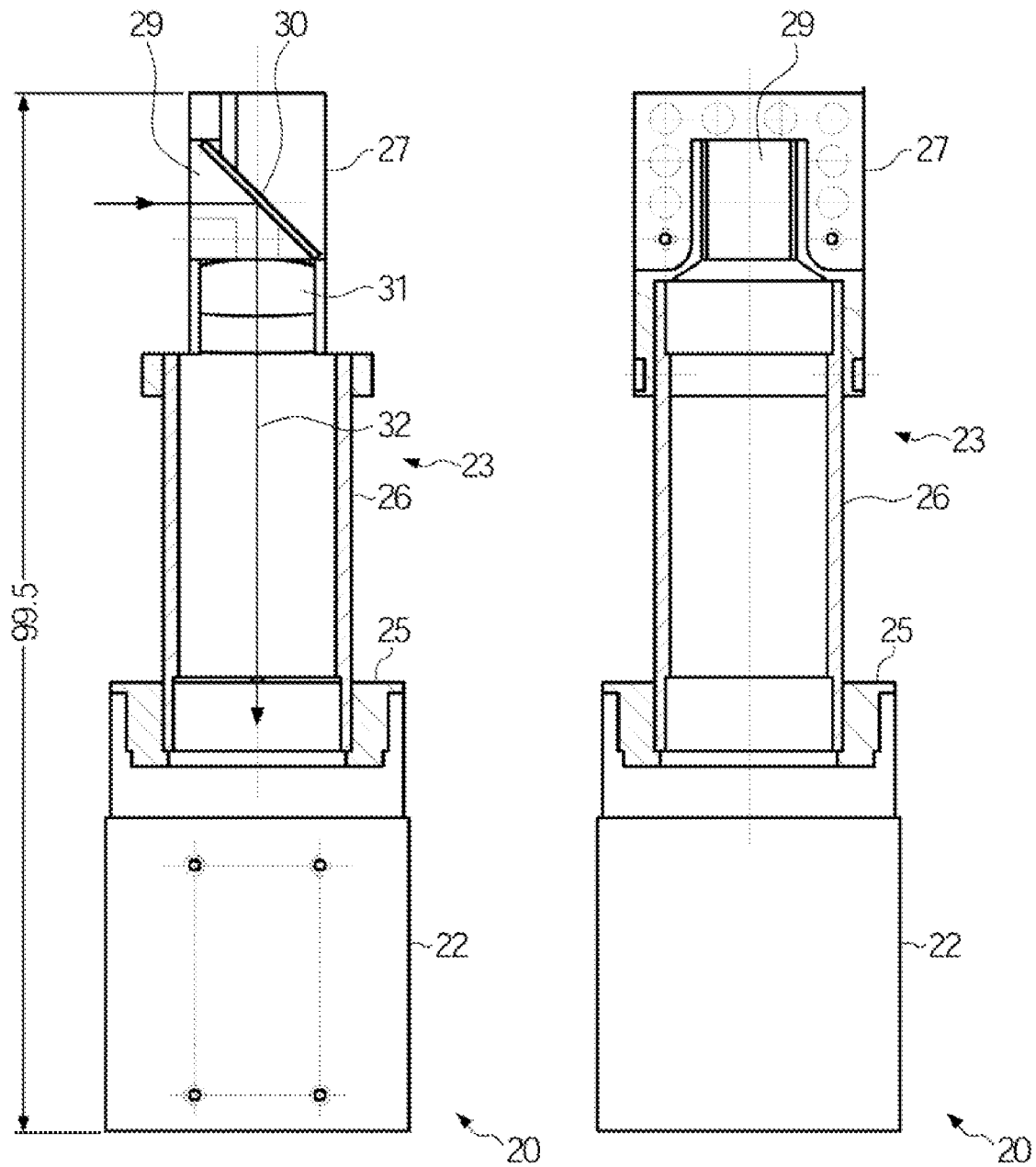

FINGER TESTER FOR TESTING UNPOPULATED PRINTED CIRCUIT BOARDS AND METHOD FOR TESTING UNPOPULATED PRINTED CIRCUIT BOARDS USING A FINGER TESTER

RELATED APPLICATIONS

This application claims priority to German Application No. DE 10 2006 006 255.8, filed on Feb. 10, 2006, which is incorporated herein by reference in its entirety.

Finger tester for the testing of non-componented printed circuit boards and method of testing non-componented printed circuit boards with a finger tester

BACKGROUND OF THE INVENTION

1. Field of the Invention

The invention relates to a finger tester for the testing of non-componented printed circuit boards, together with a method for the testing of non-componented printed circuit boards using such a finger tester. In particular the invention relates to a finger tester with several test fingers, which are moved automatically to contact circuit board test points of a circuit board to be tested.

Testers for the testing of circuit boards may be divided basically into two groups, the group of finger testers (flying probe) and the group of parallel testers. Parallel testers are testers which, by means of an adapter, contact simultaneously all or at least the majority of the contact points of a circuit board to be tested. Finger testers are testers, for the testing of non-componented or componented printed circuit boards, which scan the individual contact points in sequence using two or more test fingers.

2. Description of the Prior Art

The test fingers are generally attached to a slide which may be moved along a cross-bar, while the cross-bar in turn is guided and able to move on guide rails. The slides may therefore be positioned at any desired point of a generally rectangular test array. To contact a contact point of a circuit board to be tested, either the slide is designed to move vertically on the cross-bar or the test probe is able to move vertically on the slide, so that the test finger may be placed on the contact point of the circuit board, the circuit board test point, from above and/or from below.

A finger tester is described in EP 0 468 153 A1 and a method for the testing of circuit boards using a finger tester is described in EP 0 853 242 A1.

Test probes for finger testers are disclosed in EP 1 451 594 B1, U.S. Pat. No. 6,384,614 B1, WO 03/096037 A1 and EP 0 990 912 A2.

EP 1 451 594 B1 discloses a test probe for a finger tester for the testing of circuit boards which does not have an independent drive. The test probe is provided with a test needle, the probe tip of which may be brought into contact with a circuit board test point. The test needle is fixed pivotably to a mount by at least two pairs of elastically sprung holding arms, wherein at least one of the holding arms is made of electrically conductive material and is electrically connected to the test needle. Viewed from above, the pairs of holding arms span a triangle so that the test probe, with a very low weight which is applied during contacting of the circuit board, nevertheless has high torsional stiffness to prevent the probe tip from slipping in the course of contacting.

WO 03/096037 A1 discloses a finger tester and a method of testing circuit boards with the aid of a finger tester, in which each test finger is assigned a camera which is focussed on the probe tip of a test needle, so that the camera may be used to detect any deviation of the probe tip relative to a circuit board test point to be contacted, and the position of the test finger in the plane of the circuit board may be suitably corrected. In this document the cameras are shown schematically in vertical alignment over the respective probe tip. In practice, though, these cameras are not arranged in vertical alignment over the probe tip but instead are offset slightly to the side, so that their direction of view of the probe tip encloses an angle to the vertical of approximately 30° to 50°. The cameras thus view the probe tip of the test needle from an angle. By this means it is reliably ensured that the test fingers do not collide with their cameras, even if they must simultaneously contact two circuit board test points lying very close together. This apparatus and the corresponding method for correcting the position of the probe tip has proved very successful in practice. The method may also be used to obtain calibration data which determine the localised relationship between the contact tips of the test needles and the physical circuit board test points of the circuit board to be tested.

It is also known to provide a finger tester with a camera which is separate from the test fingers and which, before the actual testing process in which the circuit board test points are contacted by the test needles, completely covers the surface of the circuit board. For this purpose the camera is moved like a test finger parallel to the surface. This camera is aligned so as to look vertically on to the surface of the circuit board. By this means a complete image of the surface of the circuit board is obtained. Since the camera is aligned to view the surface of the circuit board vertically, the recorded image of the surface of the circuit board has significantly fewer distortions than is possible with cameras mounted on the test fingers at an angle. A direction of view aligned vertically to the surface of the circuit board is desirable since in this way the quality of the image of the surface of the circuit board is much better, and a full image of the circuit board may be produced, which is much easier to process in subsequent optical analyses.

It would therefore be a great advantage if the camera could be arranged to detect the position of the probe tip of the test needle with a vertical direction of view relative to the circuit board, since then a finger tester could dispense with the additional camera for taking an overall image of the circuit board. This additional camera requires a separate drive mechanism which takes up precious space in the finger tester. Such an overall image of the circuit board could then be taken by a camera assigned to a test finger.

Known from EP 1 122 546 A2 is a tester for the testing of circuit boards. This tester is provided with an individual camera. The camera scans the surface of a test specimen by means of a mirror mounted at an angle. Light-emitting diodes are located adjacent to the mirror as light sources.

SUMMARY OF THE INVENTION

The invention is based on the problem of developing a finger tester according to WO 03/096037 A1 in such a way that circuit board test points of a non-componented printed circuit board which lie close together may be detected without risk of collision, and that the finger tester is cost-effective in comparison with conventional testers.

The invention is also based on the problem of devising a method, for the testing of circuit boards using the apparatus, which is quick and reliable in use.

The problem is solved by a method for the testing of circuit boards using a finger tester for circuit boards which has: two or more test fingers, each with a test probe for the serial contacting of circuit board test points, wherein the test probe may be moved along the surface of a circuit board to be tested by means of a movement device, wherein an optical detection device is provided in each case for the optical detection of the position of a contact tip of the test probe of a test finger, wherein the detection devices of the test fingers are arranged on different planes or heights from the surface of the circuit board and if in positioning of the test probes in vertical coverage of the detection devices, in which at least one first detection device located further from the circuit board to be tested is shaded with respect to the circuit board by a second detection device located closer to the circuit board, then the optical data determined by the second detection device are used for positioning of the test probe of the test finger with the first detection device.

The finger tester according to the invention provides for sequential scanning of the individual contact points by two or more test fingers. The test fingers are attached in each case, in an essentially known manner, by means of a slide, which is able to move along a cross-bar. Since each test finger has an optical detection device which optically scans the immediate area being checked by the test finger, there is no possibility here of collisions between the optical detection devices. The detection devices used in the invention comprise a camera and a light guide unit which deflects the light reflected upwards in the area of the measuring point from the vertical to the horizontal, feeding it to the camera, which is mounted on the slide away from the test probe.

According to the invention the optical detection devices are arranged at different distances from the measuring point or surface of a circuit board to be tested and on different planes in terms of height. Here the distance is set so that the different planes are so far apart that, even with slides and test probes moved very close to one another, the respective light guide units are arranged one above the other, with no danger of mutual collision.

Due to the different heights of the light guide units from the contact tips of the test fingers, it is possible to direct the view of the light guide units vertically on to the surface of the circuit board. An angled position is not necessary. In this way the quality of the recorded image is much better than that obtained from a camera set at an angle.

Because of the different heights of the light guide units from the contact tip of the test probe and from a measuring point respectively, the distance over which the light must travel from the measuring point to the camera will also usually vary in length. Since however the light guide units and the camera must be focussed on the measuring point, this would require different ocular lenses. Ocular lenses are however expensive and the assignment of ocular lenses with different focussing to the light guide units arranged on different planes is very time-consuming and expensive.

In a development of the invention it is provided that, to compensate for differences in height from the measuring point, the length of the light guide units is modified and therefore also the distance covered by the light in the light guide units after deflection into the horizontal, in order to reduce the height at which the light guide units are mounted over the circuit board. Consequently the light guide units become increasingly shorter from the optical detection device located closest to the circuit board to the detection devices mounted above. This means that, according to the invention, the same objective lenses and the same lens placements may always be used, which reduces the cost of the apparatus considerably.

Due to the arrangement of the light guide units at different heights or planes it is possible that, in the course of measurement activity, test probes have to take measurements which are very close together. In such a case, a light guide unit and optical detection device in a higher position may be shaded by a corresponding light guide unit and a corresponding camera of a lower light guide unit.

The method according to the invention provides, in the case of very closely adjacent circuit board test points measured simultaneously by different test fingers, and where there is shading of one or more light guide units mounted above a first light guide unit, for use of the image of the lower light guide unit and the lower camera for the optical control and monitoring of all test fingers in this area with light guide units which are shaded.

In the apparatus according to the invention it is of advantage that, through simple design measures, a cost-effective design is obtained which allows for reliable measurement and at the same time more rapid measurement since there is less need to guard against possible collisions.

In the apparatus according to the invention it is of advantage that the measurement is considerably accelerated through the use of one camera and one camera image for the optical control and monitoring of several test fingers.

BRIEF DESCRIPTION OF THE DRAWINGS

The invention is explained with the aid of a drawing which shows in:

FIG. 8: an upper optical detection device with a light guide unit and a camera in a schematic, partly-sectioned side view FIG. 9: the device of FIG. 8 in a partly-sectioned view from below

DETAILED DESCRIPTION OF THE INVENTION

Figure 1:
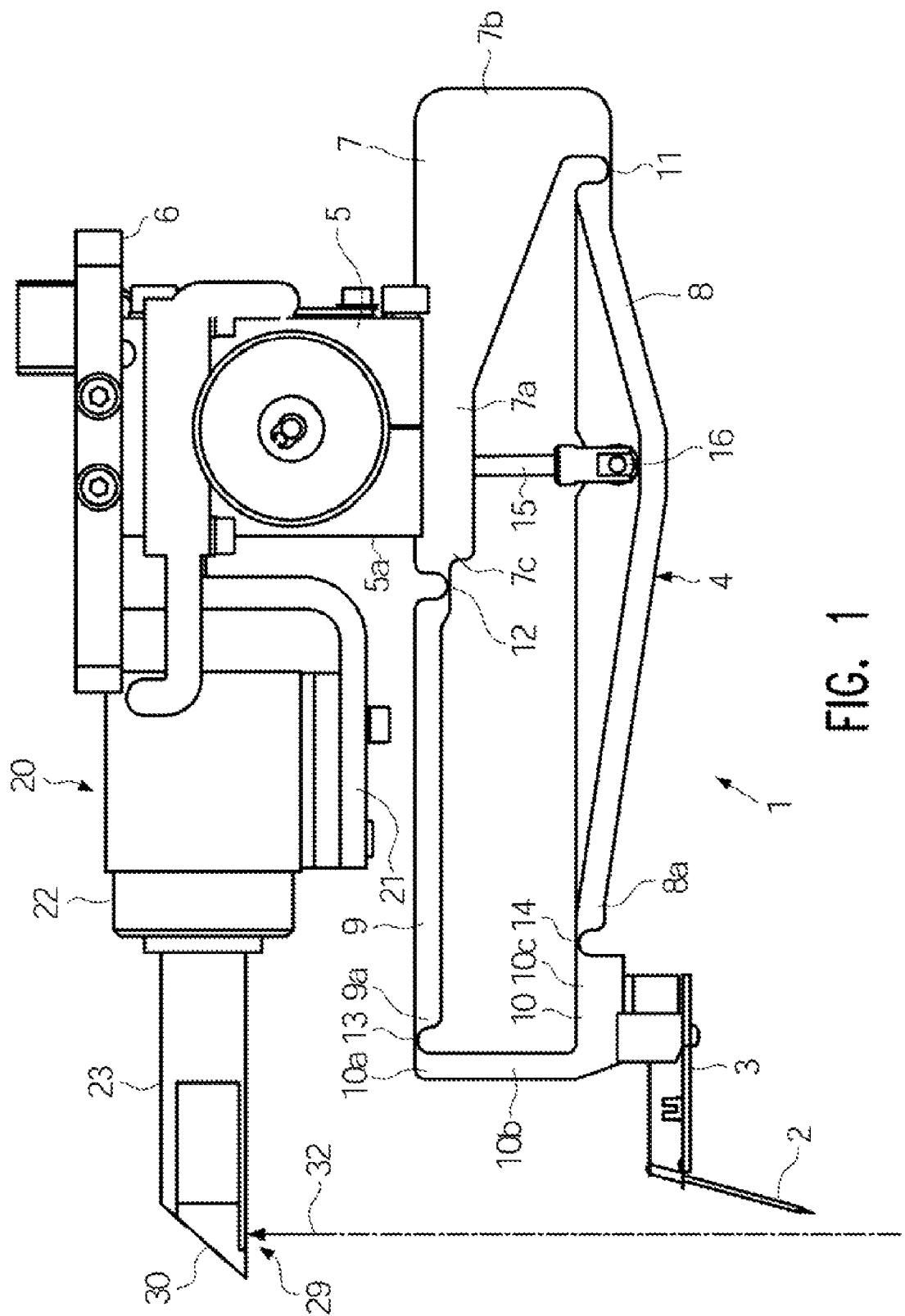
FIG. 1: a schematic side view of a test finger according to the invention for a finger tester
Figure 2:
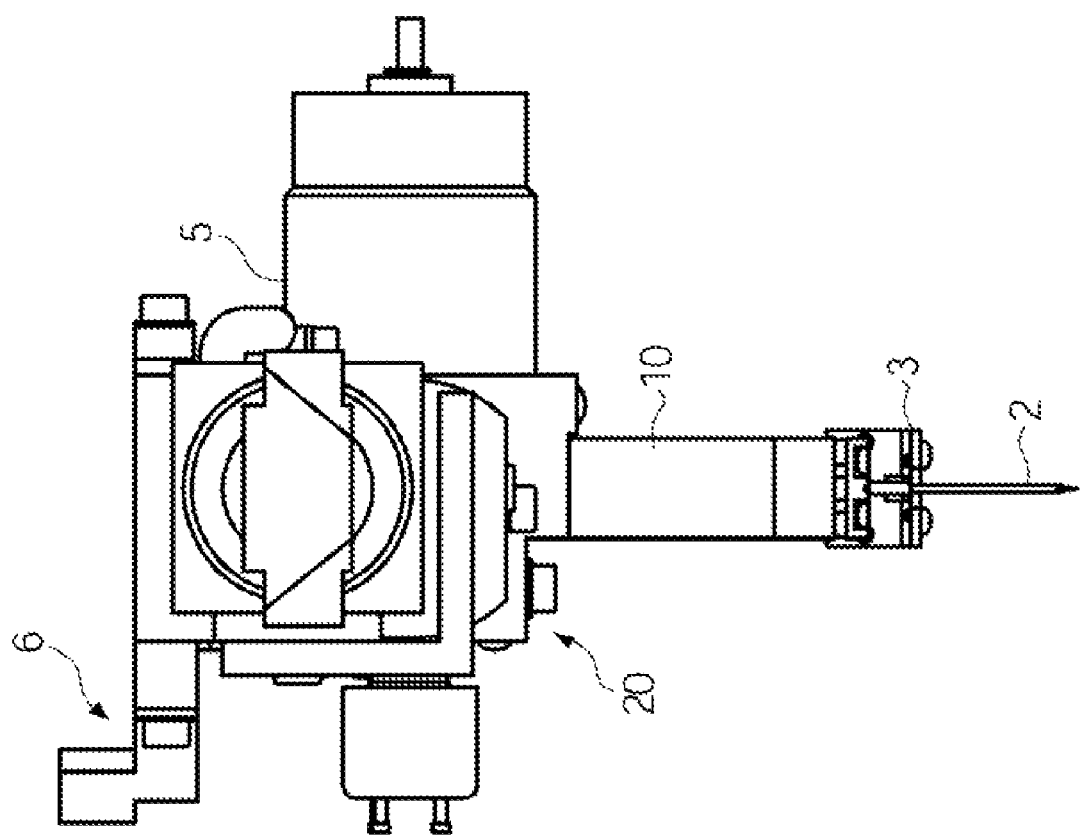
FIG. 2: the test finger of FIG. 1 in a view from above
Figure 3:
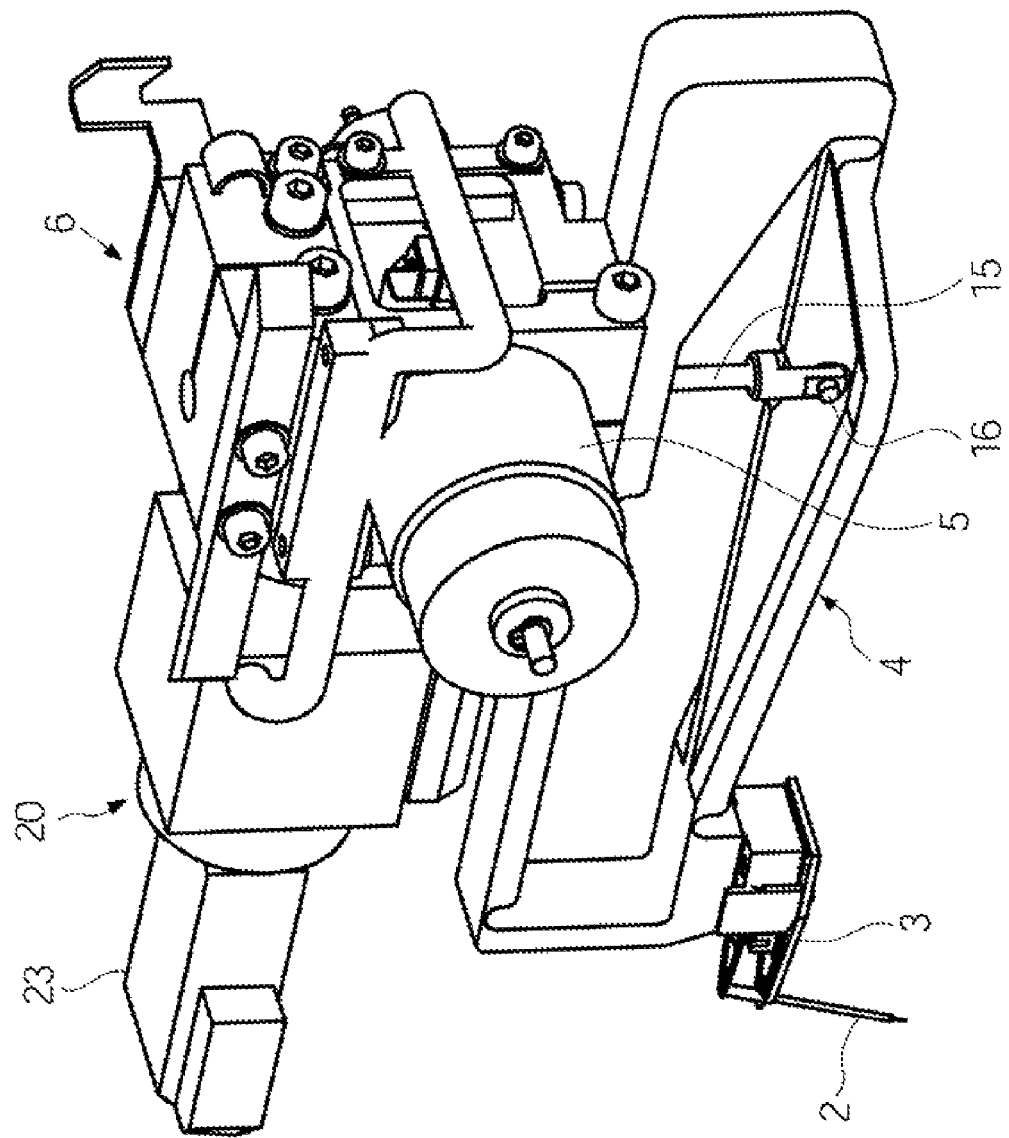
FIG. 3: the test finger of FIG. 1 in a perspective view from above

The test finger 1 according to the invention has as test probe a test needle 2 which is mounted on a lever arrangement 4 above a probe microchip 3. Such a probe microchip is known from EP 1 451 594 B1 and US 2005-001639 A1 respectively. Reference is hereby made to the full contents of these documents.

The lever arrangement 4 in turn is fixed to an actuating device 5, which has fastening devices 6 for fixing to a slide.

The slide is part of a finger tester, as disclosed for example by EP 0 468 153 A1. A slide is provided for each test finger, and the slides may be moved along cross-bars spanning a test array in which a circuit board to be tested may be mounted.

The lever arrangement 4 is a self-contained lever arrangement 4, comprised of a substantially L-shaped first support arm 7, an actuating lever 8, a top rail 9 and a probe microchip mount 10.

The L-shaped support arm 7 is fastened by its long L-leg 7a to the underside of the actuating device 5, away from which it extends. The short L-leg 7b extends downwards from the long L-leg 7a, while an actuating arm 8 extends roughly parallel to the long L-leg 7a in the same direction away from the short L-leg 7b. The actuating arm 8 is attached to the short L-leg 7b by a film hinge 11. The actuating arm 8 is roughly triangular in shape, widening opposite the long L-leg 7a of the support arm 7 and tapering to an end 8a opposite the short L-leg 7b. The actuating arm 8 extends outwards beyond the actuating device 5 and over the long L-leg 7a. Located opposite the short L-leg 7b at a free end 7c of the support arm 7 is a top rail 9 with a film hinge 12. The top rail 9 extends parallel to the long L-leg 7a and to the actuating arm 8 and, with its free end 9a extends somewhat beyond the free end 8a of the actuating arm 8. The probe microchip mount 10 is roughly L-shaped and is connected by a free end 10a of a long L-leg 10b extending parallel to the short L-leg 7b of the support arm 7, via a film hinge 13, to the top rail. A short L-leg 10c runs parallel to the top rail 9 towards the actuating arm 8 and is connected to the latter via a film hinge 14. The support arm 7, the actuating arm 8, the top rail 9 and the probe microchip mount 10 form the self-contained lever arrangement 4. The probe microchip 3 is located on the underside of the short L-leg 10c of the probe microchip mount 10.

Extending through the long L-leg 7a of the support arm 7 from the actuating device 5 is an actuating rod 15, which is attached to the actuating arm 8 via a transverse bolt 16 which reaches through the actuating rod 15 in the area of the actuating arm 8. When the actuating rod 15 moves towards the actuating device 5, the actuating arm 8 pivots around the film hinge 11, causing the probe microchip mount 10 to pivot downwards around the film hinges 13 and 14 in the opposite direction, so that the test needle 2 may rest upon a circuit board. In this connection the lever arrangement 4, or the arms and rails forming the lever arrangement are so designed that the contact tip of the test needle 2 executes a substantially purely vertical movement, but not a horizontal or a transverse movement. Altogether, when the actuating rod 15 is tightened by the actuating device 5, the probe microchip mount 10 executes a pitching movement in such a way that the contact tip of the test needle 2 moves downwards.

An optical detection device 20 is mounted above the test finger and the probe microchip mount 10 and top rail 9 respectively.

The detection device 20 has a holding device 21 which is located on a front side 5a of the actuating device. From the holding device 21, the detection device 20 extends parallel to the top rail 9 and the actuating arm 8 respectively. Adjacent to the holding device 21, the detection device 20 has a camera module 22, from which a light guide unit 23 extends parallel to the top rail 9 to a position above the test needle 2.

Figure 4:
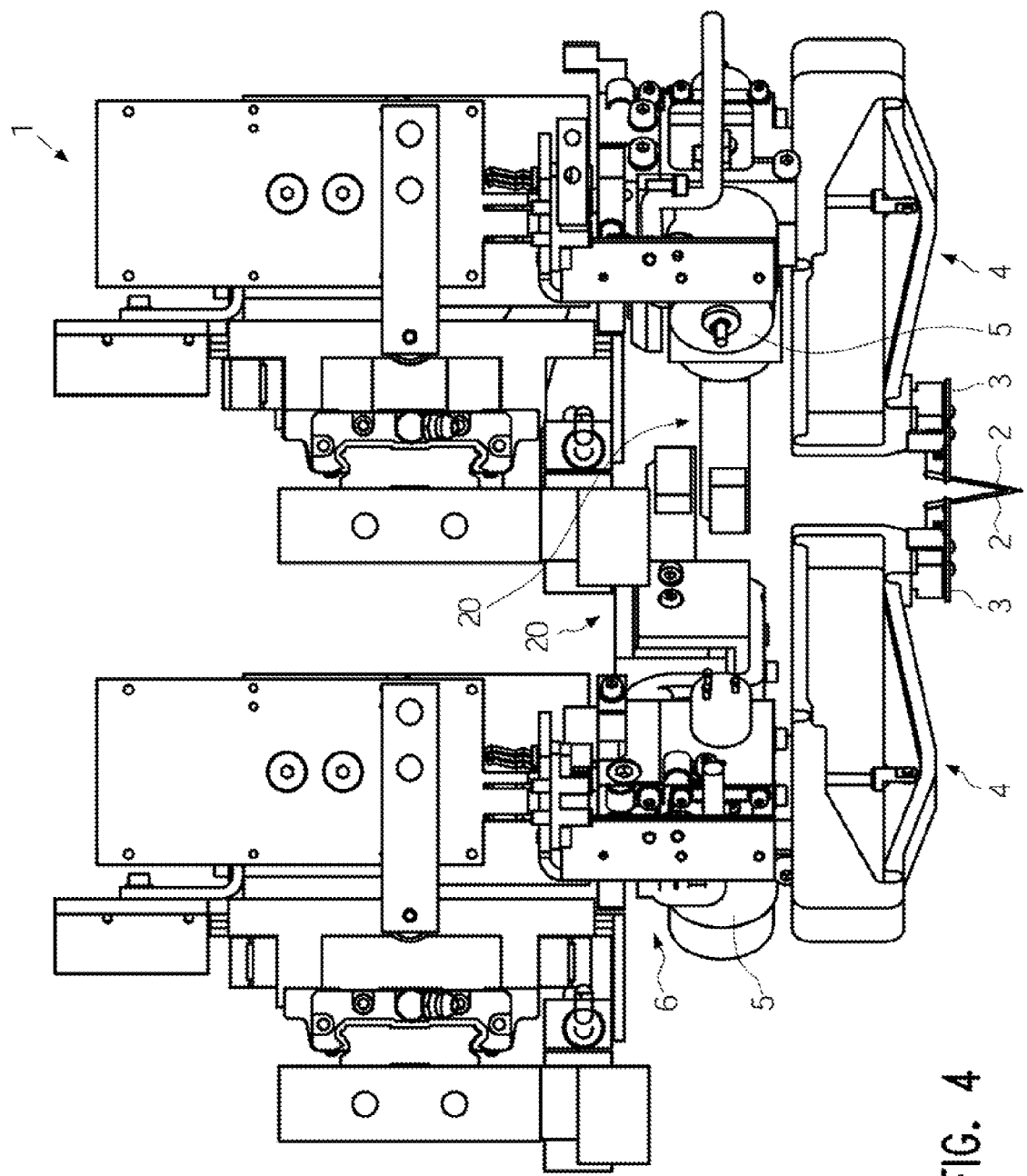
FIG. 4: two test fingers according to FIG. 1, which conduct a measurement closely adjacent to one another, with the light guide units arranged one above the other
Figure 5:
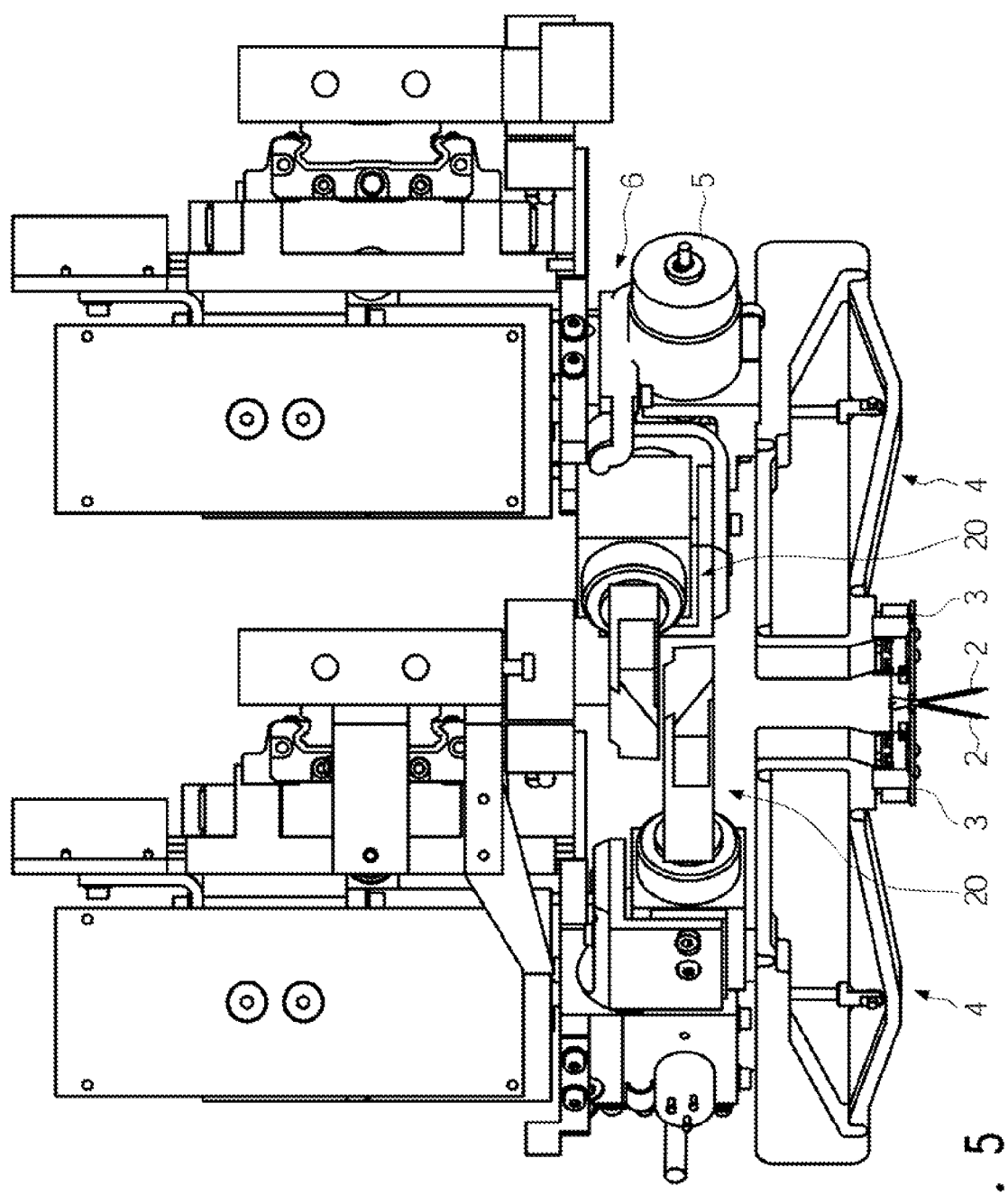
FIG. 5: the test fingers according to FIG. 4 moved still further above one another
Figures 6, 7:
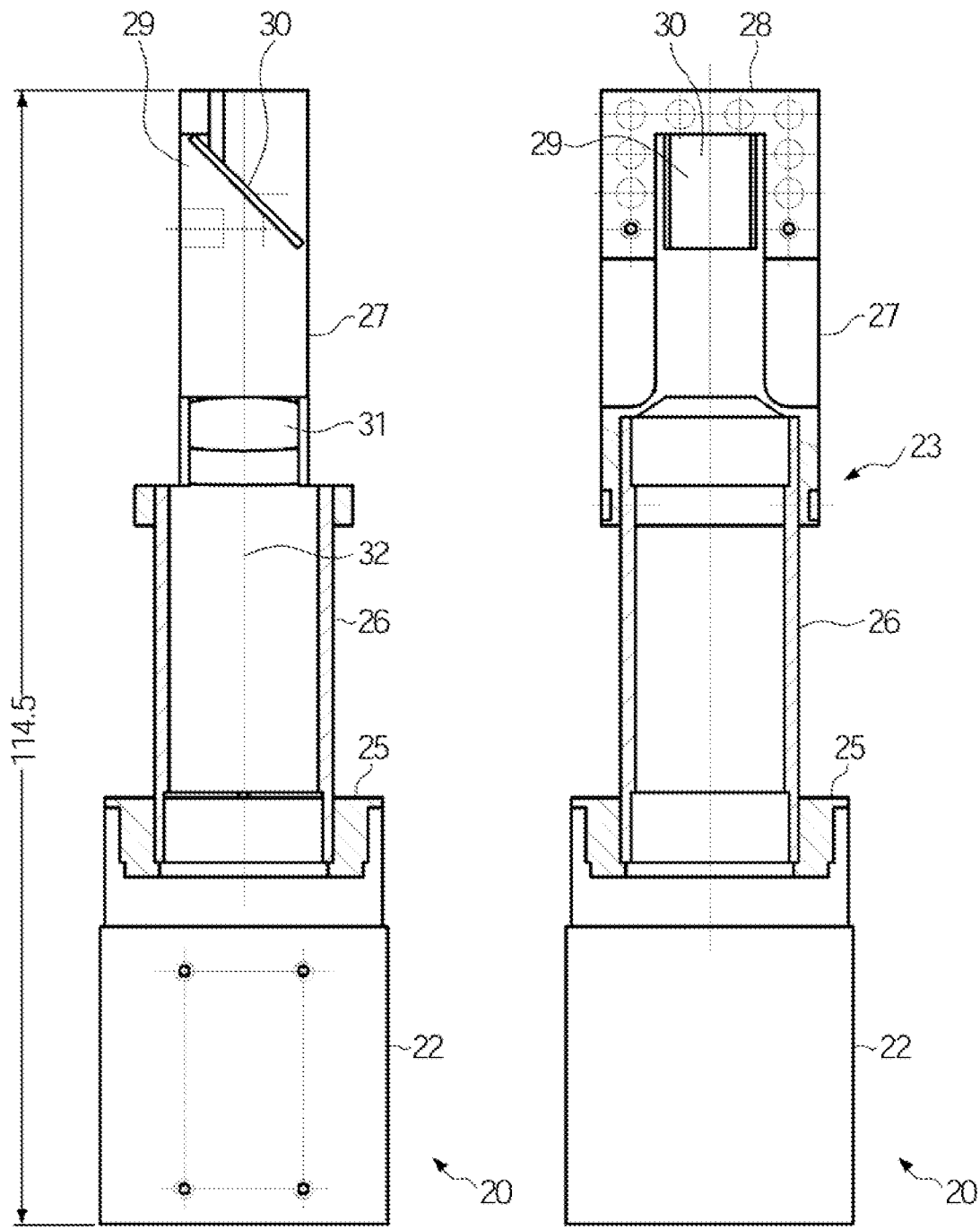
FIG. 6: a lower optical detection device with a partly-sectioned light guide unit and a camera
FIG. 7: the device of FIG. 6 in a partly-sectioned view from below
Figure 10:
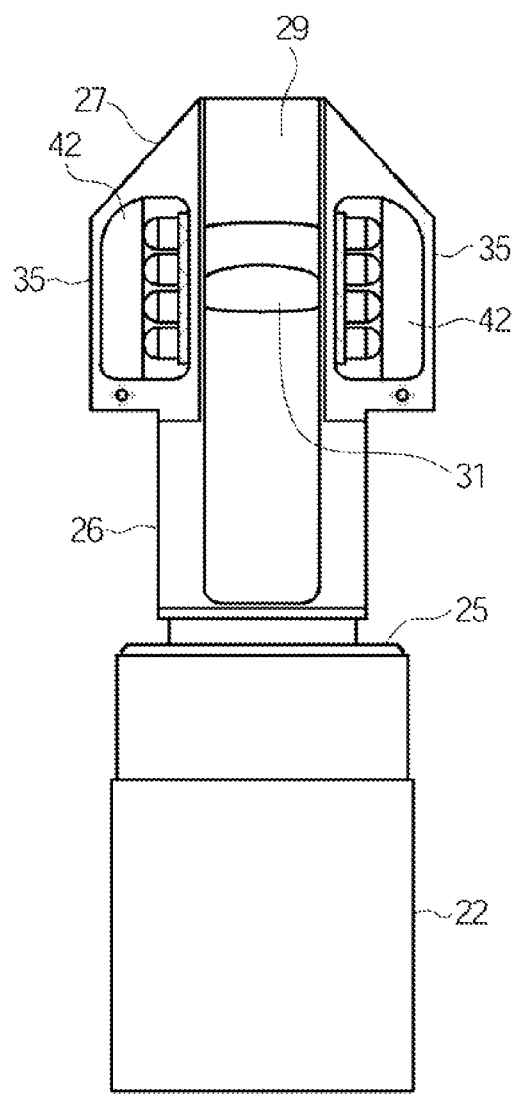
FIG. 10: a further advantageous embodiment of an optical detection device with a light guide unit and a camera with an additional lighting unit in a partly-sectioned view from below
Figure 11:
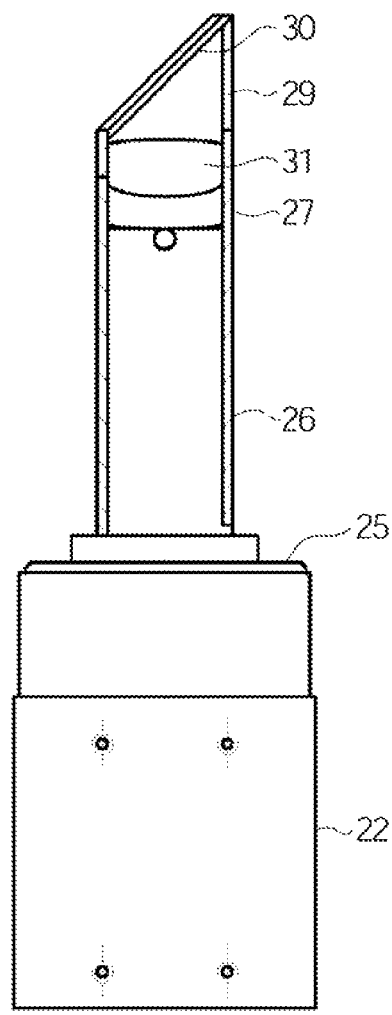
FIG. 11: the device of FIG. 10 in a partly-sectioned side view
Figure 12:
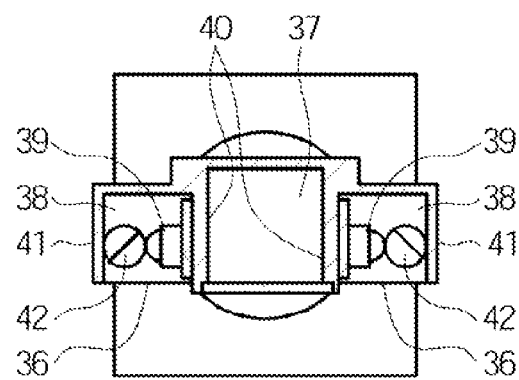
FIG. 12: the device of FIGS. 10 and 11 in a transverse view through the light guide unit in the area of the additional lighting unit.

The detection device 20 (FIGS. 6 to 12) is comprised, as already explained, of the camera module 22 and the light guide unit 23, with the camera module 22 being an essentially known camera module 22, while the light guide unit 23 extends away from a front side 25 of the camera module 22. The light guide unit 23 is substantially tubular and has a first tubular body 26 extending away from the camera module 22, with a light guide unit head 27 fitted on to a free end of the tubular body 26. The light guide unit head 27 is similarly a tubular body, with an aperture 29—for example square or rectangular—facing downwards in the area of a free end 28, i.e. towards a test needle 2. Provided in the tubular head 27 above the aperture 29 is a deflecting mirror 30 which deflects light passing through the aperture 29 into the horizontal, leading it to an objective lens 31 which is also mounted in the head 27 adjacent to the tubular body 26. Light falling from the area of the test needle 2 through the aperture 29 on to the mirror 30 is deflected into the horizontal, guided on to the objective lens 31, from which it is focussed on to a light-sensitive layer or light-sensitive area of the camera module 22. The camera module 22 usually has an optical sensor (CCD element) with an optical detection surface and an additional objective lens. The image of the tip of the test needle is formed on the optical sensor by means of the objective lens 31 and where applicable the additional objective lens provided in the camera module 22. The path of the light is shown by arrow 32 in FIGS. 8 and 1 respectively. From these it can be seen that the direction of view of the camera module 22, with the aid of the deflecting mirror 30, on to the surface of the circuit board to be scanned, is at right-angles to the surface of the circuit board and at right-angles to a test array which may include a circuit board.

Where two test probes are used (FIG. 4), for the first test probe the detection device 20 (on the left in FIG. 4) is located in the area of a first plane closer to the test needles 2, while the detection device 20 of the second test probe (on the right of FIG. 4) is mounted on a higher plane such that both detection devices 20 are spaced vertically so far apart that they will not collide with one another.

So that the path of the light from a circuit board surface (not shown) to the optical detection surfaces (not shown) of the camera modules 22 will stay the same length, a detection device 20 (FIGS. 8, 9) at a greater distance from the probe tip of the test needle 2 is designed with a head 27 which brings the mirror 30 and therefore the deflection point of the light closer to the objective lens 31 than is the case with a detection device 20 (FIGS. 6, 7) located closer to the probe tip of the test needle 2. In this way, the optical path of the light from the tip of the test needle 2 to the optical detection surface is held constant for all test fingers of a finger tester.

This requires of course that the detection device 20 is mounted further forward relative to the actuating device 5 in the direction of the test needle 2, in order to compensate for the shorter head 27. The detection devices 20 are each arranged with their mirrors 30 in vertical alignment with the tip of the test needle 2 concerned.

In an advantageous development (FIGS. 10 to 12) of the detection device 20, the head 27 has a widening 35 adjacent to and horizontally on either side of the aperture 29, with the widening 35 having openings 36 or windows 36 facing downwards to a circuit board. Mounted in the openings or behind the windows 36 are chambers 38, either side of one of the tubes 37 holding the objective lens and bounding the aperture 29. Each of the chambers 38 contains one or more light-emitting diodes 39. The light-emitting diodes 39 are mounted for example on walls 40 located adjacent to side walls of the tubes 37. Mounted on or in front of an opposite side wall 41 of the chambers 38 are mirrors 42 which have a rough or matt surface. At the same time the mirrors 42 are so oriented that light emitted from the light-emitting diodes 39 is guided down to a circuit board, with a diffuse light being obtained due to the rough or matt surface. The light reflected from the circuit board surface is guided through the aperture 29, deflected by the mirror 30 and guided through the objective lens 31 on to a suitable layer or suitable area of the camera module 22. In this variant it is of advantage that the reliability of the apparatus for evaluation and measurement is considerably enhanced by the fact that the light is diffuse and comes from a point lying adjacent to the optical path.

In the embodiments described above, a mirror 30 is used as the optical deflection element. Within the scope of the invention it is also possible, instead of the mirror 30, to provide a prism or a bundle of curved optical fibres for deflection of the light.

In finger testers it is usual to provide two or more test fingers per cross-bar (see e.g. WO 03/096037 A1). Here it is possible for a specific test finger to collide with an adjacent test finger on a cross-bar or with the test fingers of an adjacent cross-bar. If a cross-bar has e.g. exactly two test fingers, then any collision of test fingers may be avoided reliably if the detection devices 20 are arranged on four different levels or heights, wherein the two test fingers of one cross-bar are on two different levels, and the test fingers of the adjacent cross-bar are in turn on two more different levels. The detection devices of further cross-bars may again be arranged on the same level as the detection devices of other cross-bars, so long as they are not on the same level as detection devices on adjacent cross-bars. For a circuit board test point with two test fingers per cross-bar, therefore, four levels are sufficient, even if the finger tester has on one side several, e.g. ten, test fingers distributed over five cross-bars. It is thus sufficient to have as the number of different levels, double the number of test fingers per cross-bar.

The method according to the invention provides, for a situation in which test needles 2 measure adjacent to one another on a circuit board (not shown), and due to this fact the light guide unit 23 of an upper detection device 20 (on the right in FIG. 4) is shaded by the light guide unit 23 of a lower detection device 20 (on the left in FIG. 4), for the control system to be so configured that, if it is found that the image of the lower detection device 20 is shaded, test fingers 1 belonging to the upper detection device 20 are also used for control of the upper detection device 20.

If more than two test probes are used and if more than two detection devices overshadow with their light guide units, the control operation continues until all shaded detection devices use the image of the lowest detection device in the particular case for their control.

In the case of the finger tester according to the invention it is of advantage that the surface of a circuit board to be tested can be scanned with a direction of view at right-angles to the circuit board. As a result of this feature, the recorded image of the surface of the circuit board has significantly fewer distortions than would be the case if the circuit board were scanned with a direction of view at an angle to the vertical. This simplifies analysis of the images recorded in this way. A detection device designed in this way permits on the one hand control of the positioning of the test needle in contacting the circuit board test points, and on the other hand the recording of an image of the complete circuit board for further analysis, for example for comparison with synthetic images produced from CAD data of the circuit board to be tested. In this connection, reference is made to German patent application 10 2006 005 800.3.

The present invention represents a development of the method and the apparatus of WO 03/096037 A1. Reference is therefore made to the full content of this document, which is incorporated in the present application.

In the case of the finger tester according to the invention it is of advantage that a multiplicity of test probes may be used in a simple and cost-effective manner in an apparatus for the testing of non-componented printed circuit boards, without the need to change the focussing of the individual oculars.

In the method it is of advantage that several test sensors with several test fingers may be used, with very quick control being possible even in the event of overshadowing, and with all test fingers being usable despite shading.

LIST OF REFERENCE NUMBERS 1 test finger
2 test needle
3 probe microchip
4 lever arrangement
5 actuating device
6 fastening device
7 support arm
7a L-leg
7b L-leg
7c free end of support arm 7
8 actuating arm
8a end of actuating arm 8
9 top rail
10 probe microchip mount
11 film hinge
12 film hinge
13 film hinge
14 film hinge
15 actuating rod
20 detection device
21 holding device
22 camera module
23 light guide unit
25 front side
26 tubular body
27 light guide unit head
28 free end of light guide unit head 27
29 aperture
30 mirror
31 objective lens
32 arrow
35 widening
36 opening/window
37 tubes
38 chamber
39 light-emitting diode
40 wall
41 side wall
42 mirror

The invention claimed is:

1. Finger tester for the testing of non-componented printed circuit boards, the finger tester comprising at least two moveable test fingers, each having a test probe, and wherein above each said test probe a detection device is provided for optical detection of a position of at least one contact tip of said test probe, wherein the detection devices of the at least two test fingers: 1) are arranged in different vertically spaced planes, 2) are arranged on the same side of the printed circuit board, and 3) are aligned vertically, with one directly on top of the other, without contact when the test fingers simultaneously scan adjacent contact points.

2. Finger tester according to claim 1, wherein each of the detection devices has a light guide unit with a deflecting element for deflecting light from a surface of the printed circuit board on to a detection surface, wherein a distance from the surface of the printed circuit board to the respective detection surface is constant for each of the detection devices.

3. Finger tester according to claim 2, wherein each detection device comprises a camera module on which the detection surface is provided, with each light guide unit having an aperture for entry of reflected light from the surface of the circuit board in an area of the test probe, and with an objective lens being provided in a path of the light deflected by the deflecting element to focus the light on to an optical detection surface of the camera, wherein a path of the light from the surface of the circuit board to the deflecting element and from the deflecting element to the detection surface is held constant, irrespective of a height of the light guide unit above the circuit board and, to compensate for greater height, the light guide unit and/or a distance from the deflecting element to the detection surface are made shorter, corresponding to a greater height.

4. Finger tester according to claim 3, wherein the deflecting element is a mirror, a prism or a light guide.

5. Finger tester according to claim 4, each said detection device further comprising at least one lighting device to radiate diffuse light to the circuit board to be tested and to illuminate an area of the circuit board to be tested by the test probe.

6. Finger tester according to claim 5, wherein the detection device further comprises a casing with an aperture for entry of light reflected from the surface of the circuit board to be tested, said at least one lighting device located adjacent to the aperture of the casing.

7. Finger tester according to claim 6, wherein the lighting device includes a light source radiating said diffuse light, and a source mirror, having a matt surface or a rough surface, for deflecting the light received from the light source towards the surface of the circuit board to be tested.

8. Finger tester according to claim 7, wherein the lighting device comprises a light source having one or more light-emitting diodes.

9. Finger tester according to claim 8, wherein the light guide unit is tubular in shape with a first tubular body extending away from a front side of the camera module, said light guide unit further comprises a tubular light guide unit head with one free end having mounted thereon the deflecting element and an objective lens.

10. Finger tester according to claim 9, wherein each said test probe is mounted on a lever arrangement fastened with a probe microchip to an actuating device.

11. Finger tester according to claim 10, wherein the lever arrangement includes a substantially L-shaped first support arm, an actuating arm, a top rail and a probe microchip mount, forming a substantially rectangular lever arrangement, with a hinge provided between the first support arm and the actuating arm, between the first support arm and the top rail, between the actuating arm and the probe microchip mount, and between the top rail and the probe microchip mount.

12. Finger tester according to claim 11, wherein the lever arrangement is substantially elongated and rectangular, wherein an actuating rod is guided through a long L-leg of the L-shaped support arm and is connected to the actuating arm located below the long L-leg of the first support arm, and when the actuating rod and the actuating arm are raised, the actuating arm swivels around the hinge, so that the probe microchip mount swivels downwards in an opposite direction around the hinge and the test probe rests upon the circuit board.

13. Finger tester according to claim 12, wherein the optical detection device is aligned with a direction of view at right-angles to a test array to detect the circuit board to be tested.

14. Finger tester according to claim 13, wherein the test fingers are movably mounted on each of a plurality of crossbars.

15. Finger tester according to claim 3, wherein the light guide unit is tubular in shape with a first tubular body extending away from a front side of the camera module, said light guide unit further comprises a tubular light guide unit head with one free end having mounted thereon the deflecting element and an objective lens.

16. Finger tester according to claim 2, wherein the deflecting element is a mirror, a prism or a light guide.

17. Finger tester according to claim 1, each said detection device further comprising at least one lighting device to radiate diffuse light to the printed circuit board and to illuminate an area of the printed circuit board by the test probe.

18. Finger tester according to claim 17, wherein the detection device further comprises a casing with an aperture for entry of light reflected from a surface of the circuit board to be tested, said at least one lighting device located adjacent to the aperture of the casing.

19. Finger tester according to claim 17, wherein the lighting device includes a light source radiating said diffuse light, and a source mirror, having a matt surface or a rough surface, for deflecting the light received from the light source towards a surface of the circuit board to be tested.

20. Finger tester according to claim 17, wherein the lighting device comprises a light source having one or more light-emitting diodes.

21. Finger tester according to claim 1, wherein each said test probe is mounted on a lever arrangement fastened with a probe microchip to an actuating device.

22. Finger tester according to claim 21, wherein the lever arrangement includes a substantially L-sha1ped first support arm, an actuating arm, a top rail and a probe microchip mount, forming a substantially rectangular lever arrangement, with a hinge provided between the first support arm and the actuating arm, between the first support arm and the top rail, between the actuating arm and the probe microchip mount, and between the top rail and the probe microchip mount.

23. Finger tester according to claim 22, wherein the lever arrangement is substantially elongated and rectangular, wherein an actuating rod is guided through a long L-leg of the L-shaped support arm and is connected to the actuating arm located below the long L-leg of the first support arm, and when the actuating rod and the actuating arm are raised, the actuating arm swivels around the hinge, so that the probe microchip mount swivels downwards in an opposite direction around the hinge and the test probe rests upon the circuit board.

24. Finger tester according to claim 1, wherein the optical detection device is aligned with a direction of view at right-angles to a test array to detect a circuit board to be tested.

25. Finger tester according to claim 1,
wherein the test fingers are movably mounted on each of a plurality of crossbars.

26. Method for testing a circuit board using a finger tester comprising:
a first test finger and a second test finger,
a first test probe for the first test finger and a second test probe for the second test finger for serial contacting of circuit board test points, wherein the first test probe and the second test probe are moved along a surface of the circuit board to be tested by means of a movement device, and
a first detection device and a second detection device for the optical detection of positions of contact tips of said first test finger of said first test probe and said second test finger of said second test probe, respectively,
wherein the method comprises:
arranging the first detection device and the second detection device at different heights from a surface of the circuit board; and if said first detection device of said first test probe is shaded with respect to the circuit board by said second detection device, which is located closer to the circuit board, then using optical data determined by the second detection device for positioning the first test probe.

27. Method according to claim 26, wherein a path of light from the circuit board surface to a detection surface of each said detection device is maintained at a same length irrespective of the height of each said detection device above the circuit board, and light reflected from the circuit board is deflected by a mirror and guided to an objective lens, with compensation for a greater height of each said detection device from the circuit board being provided by reducing a distance between the mirror and the objective lens by an amount by which the path of the light is increased by a greater distance from the circuit board to the mirror.

* * * * *

UNITED STATES PATENT AND TRADEMARK OFFICE
CERTIFICATE OF CORRECTION

Page 1 of 1

PATENT NO. : 7,859,281 B2
APPLICATION NO. : 12/097824
DATED : December 28, 2010
INVENTOR(S) : Victor Romanov It is certified that error appears in the above-identified patent and that said Letters Patent is hereby corrected as shown below:

In Claim 22, column 10, line 28, delete "L-sha1ped" and insert -- L-shaped --.

Signed and Sealed this
Twenty-second Day of March, 2011

David J. Kappos
*Director of the United States Patent and Trademark Office*